US012230741B2

(12) United States Patent
Lee et al.

(10) Patent No.: US 12,230,741 B2
(45) Date of Patent: Feb. 18, 2025

(54) DISPLAY PANEL AND ELECTRONIC DEVICE

(71) Applicant: Samsung Display Co., Ltd., Yongin-si (KR)

(72) Inventors: Eung Gyu Lee, Cheonan-si (KR); Jin Suek Kim, Hwaseong-si (KR); Seung Bo Shim, Asan-si (KR); Ho Kil Oh, Seoul (KR); Bo Bae Lee, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 713 days.

(21) Appl. No.: 17/445,120

(22) Filed: Aug. 16, 2021

(65) Prior Publication Data
US 2022/0158043 A1 May 19, 2022

(30) Foreign Application Priority Data

Nov. 13, 2020 (KR) .................... 10-2020-0151746

(51) Int. Cl.
*H01L 33/50* (2010.01)
*B82Y 20/00* (2011.01)
(Continued)

(52) U.S. Cl.
CPC .......... *H01L 33/502* (2013.01); *H01L 27/156* (2013.01); *H01L 33/32* (2013.01);
(Continued)

(58) Field of Classification Search
CPC ..... H01L 33/502; H01L 27/156; H01L 33/32; H01L 2933/0091; H01L 25/0753; H01L 33/507; H01L 25/167; H01L 33/58; H01L 33/60; H01L 33/30; H10K 50/854; H10K 59/12; H10K 59/38; H10K 59/879; H10K 59/877; H10K 59/878; H10K 2102/331; H10K 59/122; H10K 50/115; B82Y 20/00;
(Continued)

(56) References Cited

U.S. PATENT DOCUMENTS

2018/0159080 A1* 6/2018 Shimoyama ........... H10K 59/38
2019/0172874 A1* 6/2019 Lim ....................... H10K 59/35
(Continued)

FOREIGN PATENT DOCUMENTS

JP          2005-352105 A    12/2005
KR   10-2017-0126912 A      11/2017
(Continued)

*Primary Examiner* — Jonathan Han
(74) *Attorney, Agent, or Firm* — Lewis Roca Rothgerber Christie LLP

(57) ABSTRACT

Disclosed are a display panel including a light emitting panel, and a color conversion panel facing the light emitting panel, wherein the color conversion panel being converts an emission spectrum of light emitted from the light emitting panel, wherein the color conversion panel may include a color conversion layer including a plurality of regions including a color conversion region, and bank defining each region of the color conversion layer, the color conversion region may include quantum dots, and a refractive index of the bank is lower than a refractive index of the quantum dots, and an electronic device including the same.

19 Claims, 10 Drawing Sheets

(51) Int. Cl.
   *H01L 27/15*    (2006.01)
   *H01L 33/32*    (2010.01)
   *H10K 50/854*   (2023.01)
   *H10K 59/12*    (2023.01)
   *H10K 59/38*    (2023.01)

(52) U.S. Cl.
   CPC ............ *H10K 50/854* (2023.02); *H10K 59/12* (2023.02); *H10K 59/38* (2023.02); *B82Y 20/00* (2013.01); *H01L 2933/0091* (2013.01)

(58) Field of Classification Search
   CPC .... G02B 5/206; G02B 6/0026; G02B 6/0065; G02B 6/0073
   See application file for complete search history.

(56) References Cited

U.S. PATENT DOCUMENTS

| | | | | |
|---|---|---|---|---|
| 2019/0244559 A1* | 8/2019 | Cho | .................... | G09G 3/32 |
| 2020/0343230 A1* | 10/2020 | Sizov | .................... | H01L 25/0753 |
| 2021/0391395 A1* | 12/2021 | Shin | .................... | H10K 59/122 |

FOREIGN PATENT DOCUMENTS

| | | |
|---|---|---|
| KR | 10-1854505 B1 | 5/2018 |
| KR | 10-2020-0028028 A | 3/2020 |
| KR | 10-2020-0042058 A | 4/2020 |
| KR | 10-2020-0059991 A | 5/2020 |

\* cited by examiner

DISPLAY PANEL AND ELECTRONIC DEVICE

CROSS-REFERENCE TO RELATED APPLICATION

This application claims priority to and the benefit of Korean Patent Application No. 10-2020-0151746 filed in the Korean Intellectual Property Office on Nov. 13, 2020, the entire contents of which are hereby incorporated by reference.

BACKGROUND

1. Field

Embodiments of the present disclosure relate to a display panel and, for example, an electronic device.

2. Description of the Related Art

Electronic devices including a display panel such as a liquid crystal display panel, a plasma display panel, or an organic light emitting diode display panel are commercially available.

Meanwhile, research on display panels including semiconductor nanocrystals called quantum dots has recently been conducted.

SUMMARY

One or more embodiments of the present disclosure provide a display panel capable of improving light conversion efficiency by reducing loss of light in a display panel including quantum dots.

One or more embodiments of the present disclosure provide an electronic device including the display panel.

According to one or more embodiments, a display panel may include a light emitting panel, and a color conversion panel facing the light emitting panel, where the color conversion panel converts an emission spectrum of light emitted from the light emitting panel, where the color conversion panel may include a color conversion layer including a plurality of regions, including a color conversion region and a bank defining each region of the color conversion layer, the color conversion region may include quantum dots, and a refractive index of the bank may be lower than a refractive index of the quantum dots.

Each of the refractive indexes of the quantum dots at wavelengths of about 460 nm, about 550 nm, and about 630 nm may be about 1.6 to about 2.0, and the refractive index of the bank at wavelengths of about 460 nm, about 550 nm, and about 630 nm may be about 1.1 to about 1.4.

A difference between the refractive index of the quantum dots and the refractive index of the bank may be about 0.2 to about 0.8.

The color conversion region and the bank may be in direct contact.

The bank may have a transmittance of about 10% to about 70%.

The bank may include a plurality of pigments and a plurality of scatterers, and the plurality of pigments and the plurality of scatterers may have different absorption spectra.

The plurality of pigments may include at least two selected from a first pigment having a maximum absorption wavelength in a range of greater than or equal to about 380 nm and less than about 500 nm, a second pigment having a maximum absorption wavelength in a range of about 500 nm to about 600 nm, and a third pigment having a maximum absorption wavelength in a range of greater than about 600 nm and less than or equal to about 780 nm.

The plurality of scatterers may include silicon oxide, zinc oxide, titanium oxide, tantalum oxide, niobium oxide, tin oxide, magnesium oxide, nanosilicate, calcium carbonate, calcium fluoride, porogen, or a combination thereof.

The bank may concurrently (e.g., simultaneously) satisfy a refractive index of about 1.1 to about 1.4 and a transmittance of about 10% to about 70% at wavelengths of about 460 nm, about 550 nm, and about 630 nm.

The bank may include a first bank between the adjacent color conversion regions, and a second bank connected to or separated from the first bank and protruding toward the light emitting panel.

A surface of the first bank may be hydrophilic and a surface of the second bank may be hydrophobic.

The second bank may be connected to the first bank and may include the same material as the first bank.

The light emitting panel may include a light emitting element to emit light of a first emission spectrum, and the color conversion layer may include a first color conversion region including a first quantum dot to convert light of the first emission spectrum into light of a second emission spectrum, a second color conversion region including a second quantum dot to convert light of the first emission spectrum into light of a third emission spectrum, and a light transmitting region through which light of the first emission spectrum passes. The refractive indexes of the bank at wavelengths of the first, second, and third emission spectra may be respectively lower than the refractive indexes of the first quantum dot and the second quantum dot at wavelengths of the first, second, and third emission spectra.

The first emission spectrum may be a blue emission spectrum, the second emission spectrum may be a red emission spectrum, and the third emission spectrum may be a green emission spectrum.

The color conversion panel may further include a color filter layer in a direction in which light passing through the color conversion layer is emitted.

The display panel may further include a light transmitting layer between the light emitting panel and the color conversion panel.

The light emitting panel may include an organic light emitting diode, a quantum dot light emitting diode, a perovskite light emitting diode, a micro light emitting diode, an inorganic nano light emitting diode, or a combination thereof.

The light emitting panel may emit light of a blue emission spectrum.

The inorganic nano light emitting diode may include a nanostructure including gallium nitride GaN, indium gallium nitride InGaN, aluminum gallium nitride AlGaN, or a combination thereof.

According to one or more embodiments, an electronic device including the display panel is provided.

The loss of light in the display panel including the quantum dots may be reduced, and thus light conversion efficiency may be improved, and ultimately, the light efficiency of the display panel may be improved.

DETAILED DESCRIPTION

Figure 1:
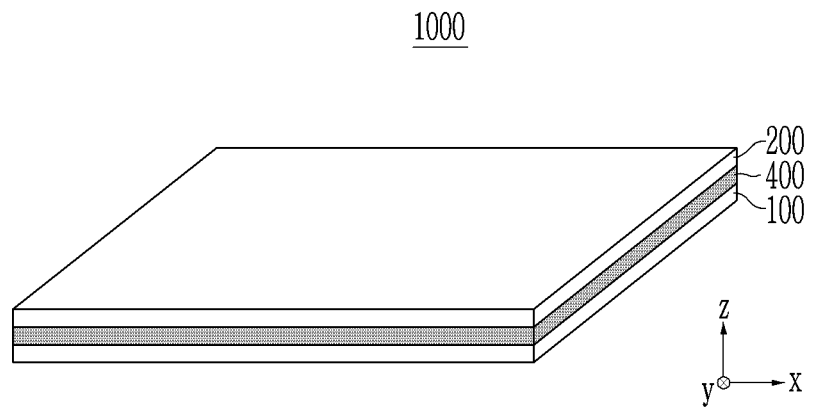
FIG. 1 is a perspective view showing an example of a display panel according to one or more embodiments.

Hereinafter, various embodiments of the present disclosure will be described in more detail with reference to the accompanying drawings so that those of ordinary skill in the art may easily implement embodiments of the present disclosure. The subject matter of the present disclosure may be implemented in various different forms and is not limited to the embodiments described herein.

The drawings and description are to be regarded as illustrative in nature and not restrictive. Like reference numerals designate like elements throughout the specification.

Further, in the drawings, size and thickness of each element may be arbitrarily represented for better understanding and ease of description, but the present disclosure is not limited thereto. In the drawings, the thickness of layers, films, panels, regions, etc., may be exaggerated for clarity. In addition, in the drawings, for better understanding and ease of description, the thickness of some layers and areas may be exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means being on or below the object portion, and does not necessarily mean being on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

In addition, in this specification, the phrase "on a plane" or "in a plane" means viewing a target portion from the top, and the phrase "on a cross-section" or "in a cross-section" means viewing a cross-section formed by vertically cutting a target portion from the side.

Hereinafter, the term "combination" includes a chemical combination, a mixture, and a laminated structure of two or more.

Hereinafter, a display panel according to one or more embodiments will be described.

Figure 2:
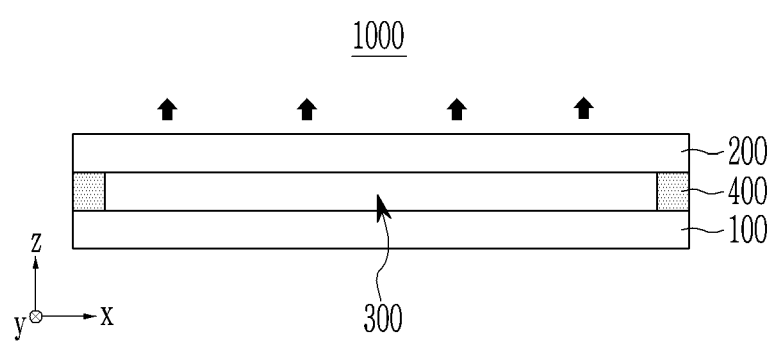
FIG. 2 is a cross-sectional view of the display panel of FIG. 1.
Figure 3:
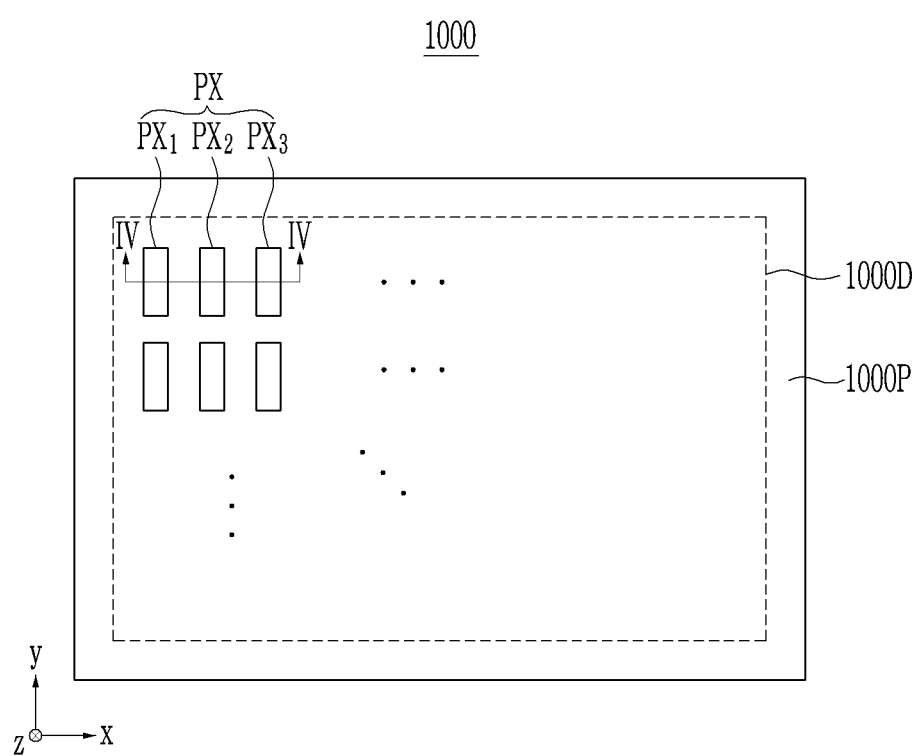
FIG. 3 is a plan view illustrating an example of a pixel arrangement of the display panel of FIG. 1.
Figure 4:
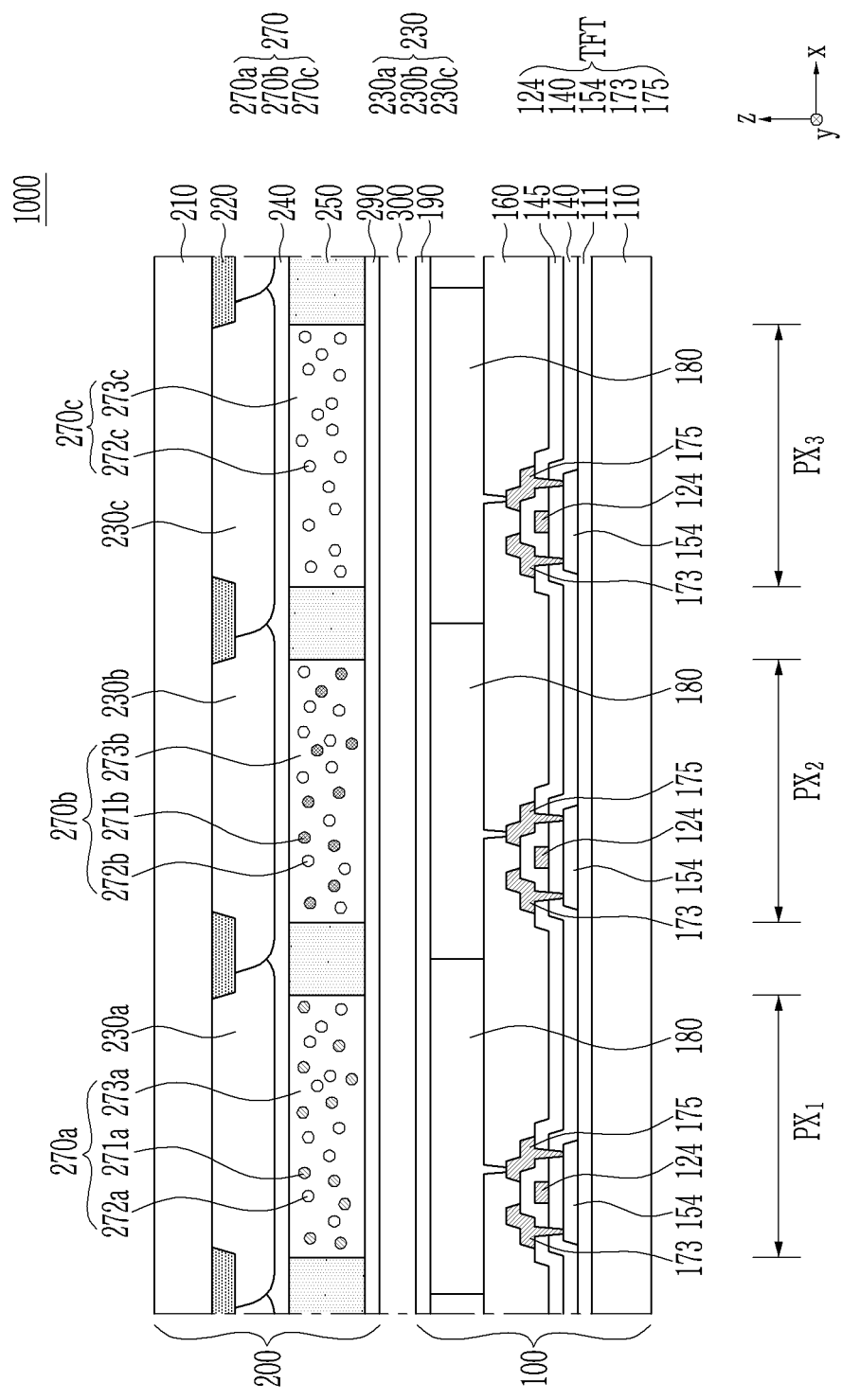
FIG. 4 is a cross-sectional view of the display panel of FIG. 3 taken along line IV-IV.

FIG. 1 is a perspective view illustrating an example of a display panel according to one or more embodiments, FIG. 2 is a cross-sectional view of the display panel of FIG. 1, FIG. 3 is a plan view illustrating an example of an arrangement of pixels of the display panel of FIG. 1, and FIG. 4 is a cross-sectional view of the display panel of FIG. 3 taken along line IV-IV.

Referring to FIGS. 1 and 2, the display panel 1000 according to one or more embodiments may include a light emitting panel 100, a color conversion panel 200, and a light transmitting layer 300 between the light emitting panel 100 and the color conversion panel 200, and a binding element 400 for combining the light emitting panel 100 and the color conversion panel 200.

The light emitting panel 100 and the color conversion panel 200 may face each other with the light transmitting layer 300 therebetween, and the color conversion panel 200 may be in a direction in which light is emitted from the light emitting panel 100. The binding element 400 may be along the edges of the light emitting panel 100 and the color conversion panel 200, and may be, for example, a sealant.

Referring to FIG. 3, a display panel 1000 according to one or more embodiments may include a display area 1000D for displaying an image and a non-display area 1000P around the display area 1000D where the binding element 400 may be located.

The display area 1000D may include a plurality of pixels PXs arranged along a row (e.g., x direction) and/or a column (e.g., y direction), and each pixel PX may include a plurality of sub-pixels $PX_1$, $PX_2$, and $PX_3$ to display different colors. Herein, as an example, a configuration in which three sub-pixels $PX_1$, $PX_2$, and $PX_3$ constitute one pixel PX is illustrated, but the configuration is not limited thereto. An additional sub-pixel such as a white sub-pixel may be further included, and one or more sub-pixel displaying the same color may be included. The plurality of pixels PXs may be arranged in, for example, a Bayer matrix, a PENTILE® matrix or arrangement structure (e.g., an RGBG matrix, RGBG structure, or RGBG matrix structure), and/or a diamond matrix, but embodiments of the present disclosure are not limited thereto. PENTILE® is a duly registered trademark of Samsung Display Co., Ltd.

Each of the sub-pixels $PX_1$, $PX_2$, and $PX_3$ may display a color of three primary colors or a combination of three primary colors, for example, red, green, blue, or a combination thereof. For example, the first sub-pixel $PX_1$ may display red, the second sub-pixel $PX_2$ may display green, and the third sub-pixel $PX_3$ may display blue.

In the drawings, an example in which all sub-pixels have the same size is illustrated, but the present disclosure is not limited thereto. At least one of the sub-pixels may be larger or smaller than the other sub-pixels. In the drawings, an example in which all sub-pixels have the same shape may be illustrated, but the present disclosure is not limited thereto. At least one of the sub-pixels may have a different shape from other sub-pixels.

Referring to FIG. 4, the light emitting panel 100 and the color conversion panel 200 is sequentially described.

The light emitting panel 100 may include a light emitting element to emit light in a set or predetermined wavelength spectrum and a circuit element for switching and/or driving the light emitting element. For example, the light emitting panel 100 may include a lower substrate 110, a buffer layer 111, a thin film transistor TFT, a light emitting element 180, and an encapsulation layer 190.

The lower substrate 110 may be a glass substrate and/or a polymer substrate. The polymer substrate may include, for example, polyimide, polyamide, polyamideimide, polyethylene terephthalate, polyethylene naphthalene, polymethyl methacrylate, polycarbonate, a copolymer thereof, or a combination thereof, but is not limited thereto.

The buffer layer 111 may include an organic material, an inorganic material, an organic-inorganic material, or a combination thereof. The buffer layer 111 may include, for example, an oxide, a nitride, and/or an oxynitride, and may include, for example, silicon oxide, silicon nitride, silicon oxynitride, or a combination thereof, but is not limited thereto. The buffer layer 111 may be one layer or two or more layers, and may cover the entire surface of the lower substrate 110. In some embodiments, the buffer layer 111 may be omitted.

The thin film transistor TFT may be a three-terminal element for switching and/or driving the light emitting element 180, which will be further described below, and one or two or more may be included for each sub-pixel. The thin film transistor TFT may include a gate electrode 124, a semiconductor layer 154 overlapped with the gate electrode 124, a gate insulating layer 140 between the gate electrode 124 and the semiconductor layer 154, and a source electrode 173 and a drain electrode 175 electrically coupled to the semiconductor layer 154. In the drawings, a coplanar top gate structure may be shown as an example, but the structure is not limited thereto and may have various structures.

The gate electrode 124 may be electrically coupled to a gate line, and may include, for example, a low-resistance metal such as aluminum (Al), molybdenum (Mo), copper (Cu), titanium (Ti), silver (Ag), gold (Au), an alloy thereof, or a combination thereof, but is not limited thereto.

The semiconductor layer 154 may be an inorganic semiconductor such as amorphous silicon, polycrystalline silicon, and/or oxide semiconductor; an organic semiconductor; an organic-inorganic semiconductor; or a combination thereof. For example, the semiconductor layer 154 may include an oxide semiconductor including at least one selected from indium (In), zinc (Zn), tin (Sn), and gallium (Ga), and the oxide semiconductor may include, for example, indium-gallium-zinc oxide, zinc-tin oxide, or a combination thereof, but they are not limited thereto. The semiconductor layer 154 may include a channel region and doped regions on both sides of the channel region and may be electrically coupled to the source electrode 173 and the drain electrode 175, respectively.

The gate insulating layer 140 may include an organic material, an inorganic material, or an organic-inorganic material, and may include, for example, an oxide, a nitride, and/or an oxynitride, and may include, for example, silicon oxide, silicon nitride, silicon oxynitride, or a combination thereof, but is not limited thereto. In the drawings, an example in which the gate insulating layer 140 may be formed on the entire surface of the lower substrate 110 may be illustrated, but the present disclosure is not limited thereto and may be selectively formed between the gate electrode 124 and the semiconductor 154. The gate insulating layer 140 may be formed of one, two, or more layers.

The source electrode 173 and the drain electrode 175 may include, for example, a low-resistance metal such as aluminum (Al), molybdenum (Mo), copper (Cu), titanium (Ti), silver (Ag), gold (Au), an alloy thereof, or a combination thereof, but are not limited thereto. The source electrode 173 and the drain electrode 175 may be electrically coupled to the doped regions of the semiconductor layer 154, respectively. The source electrode 173 may be electrically coupled to a data line, and the drain electrode 175 may be electrically coupled to a light emitting element 180 to be further described below.

An interlayer insulating layer 145 may be additionally formed between the gate electrode 124 and the source/drain electrodes 173/175. The interlayer insulating layer 145 may include an organic material, an inorganic material, an organic-inorganic material, or a combination thereof, for example, oxide, nitride, and/or oxynitride, for example, silicon oxide, silicon nitride, silicon oxynitride, or a combination thereof, but is not limited thereto. The interlayer insulating layer 145 may be formed of one, two, or more layers.

A protective layer 160 may be formed on the thin film transistor TFT. The protective layer 160 may be, for example, a passivation layer. The protective layer 160 may include an organic material, an inorganic material, an organic-inorganic material, or a combination thereof, for example, polyacrylic, polyimide, polyamide, polyamideimide, or a combination thereof, but is not limited thereto. The protective layer 160 may be formed of one, two, or more layers.

The light emitting element 180 may be in each sub-pixel $PX_1$, $PX_2$, and $PX_3$, and the light emitting element 180 in each sub-pixel $PX_1$, $PX_2$, and $PX_3$ may be independently driven. The light emitting element 180 may be, for example, a light emitting diode, and may include a pair of electrodes and a light emitting layer between the pair of electrodes. The light emitting layer may include a light emitter to emit light in a set or predetermined wavelength spectrum, and, for example, may include a light emitter to emit light of a first emission spectrum belonging to a visible wavelength spectrum. The light emitter may include an organic light emitter, an inorganic light emitter, an organic-inorganic light emitter, or a combination thereof, and may be one type or two or more types.

The light emitting element 180 may be, for example, an organic light emitting diode, an inorganic light emitting diode, or a combination thereof. The inorganic light emitting diode may be, for example, a quantum dot light emitting diode, a perovskite light emitting diode, a micro light emitting diode, an inorganic nano light emitting diode, or a combination thereof, but is not limited thereto.

FIGS. 5 to 8 are cross-sectional views showing examples of light emitting elements, respectively.

Figure 5:
FIGS. 5 to 8 are cross-sectional views showing examples of light emitting elements, respectively.

Referring to FIG. 5, the light emitting element 180 may include a first electrode 181 and a second electrode 182 facing each other; a light emitting layer 183 between the first electrode 181 and the second electrode 182; and optionally auxiliary layers 184 and 185 between the first electrode 181 and the light emitting layer 183 and between the second electrode 182 and the light emitting layer 183.

The first electrode 181 and the second electrode 182 may face each other along a thickness direction (for example, the z direction), and any one selected from the first electrode 181 and the second electrode 182 may be an anode and the other may be a cathode. The first electrode 181 may be a light transmitting electrode, a transflective electrode, or a reflective electrode, and the second electrode 182 may be a light transmitting electrode or a transflective electrode. The light transmitting electrode or transflective electrode may be, for example, made of a single layer or multiple layers of metal thin film including conductive oxides such as indium tin oxide ITO, indium zinc oxide IZO, zinc oxide ZnO, tin oxide SnO, aluminum tin oxide AlTO, and/or fluorine-doped tin oxide FTO and/or silver Ag, copper Cu, aluminum Al, magnesium Mg, magnesium-silver Mg—Ag, magnesium-aluminum Mg—Al, or a combination thereof. The reflective electrode may include a metal, a metal nitride, or a combination thereof, for example, silver Ag, copper Cu, aluminum Al, gold Au, titanium Ti, chromium Cr, nickel Ni, an alloy thereof, a nitride thereof (e.g., TiN), or a combination thereof, but is not limited thereto.

The light emitting layer 183 may include a light emitter to emit light of a first emission spectrum. The first emission spectrum may belong to a relatively short wavelength region in the visible light wavelength spectrum, and may be, for example, a blue emission spectrum. The maximum emission wavelength of the blue emission spectrum may belong to a wavelength range of greater than or equal to about 400 nm and less than about 500 nm, and may belong to a wavelength range of about 410 nm to about 490 nm or about 420 nm to about 480 nm within the above range. The light emitter may be one, two, or more.

For example, the light emitting layer 183 may include a host material and a dopant material.

For example, the light emitting layer 183 may include a phosphorescent material, a fluorescent material, or a combination thereof.

For example, the light emitter may include an organic light emitter, and the organic light emitter may be a low molecular weight compound, a polymer, or a combination thereof. When the light emitter may include an organic light emitter, the light emitting element 180 may be an organic light emitting diode.

For example, the light emitter may include an inorganic light emitter, and the inorganic light emitter may be an inorganic semiconductor, quantum dot, perovskite, or a combination thereof. When the light emitter may include an inorganic light emitter, the light emitting element 180 may be a quantum dot light emitting diode, a perovskite light emitting diode, and/or a micro light emitting diode.

The auxiliary layers 184 and 185 may be between the first electrode 181 and the light emitting layer 183 and between the second electrode 182 and the light emitting layer 183, respectively, and may be a charge auxiliary layer to control injection and/or mobility of charge carriers, respectively. Each of the auxiliary layers 184 and 185 may be one or two or more layers, and may be, for example, a hole injection layer, a hole transport layer, an electron blocking layer, an electron injection layer, an electron transport layer, a hole blocking layer, or a combination thereof. In some embodiments, one or both of the auxiliary layers 184 and 185 may be omitted.

The light emitting elements 180 in each of the sub-pixels $PX_1$, $PX_2$, and $PX_3$ may be the same or different from each other. The light emitting elements 180 in each of the sub-pixels $PX_1$, $PX_2$, and $PX_3$ may emit light of the same emission spectrum, for example, each may emit light of a blue emission spectrum, for example, light of a blue emission spectrum having a maximum emission wavelength in a wavelength region of greater than or equal to about 400 nm and less than about 500 nm, about 410 nm to about 490 nm, or about 420 nm to about 480 nm. The light emitting elements 180 in each of the sub-pixels $PX_1$, $PX_2$, and $PX_3$ may be separated by a pixel defining layer.

Figure 6:
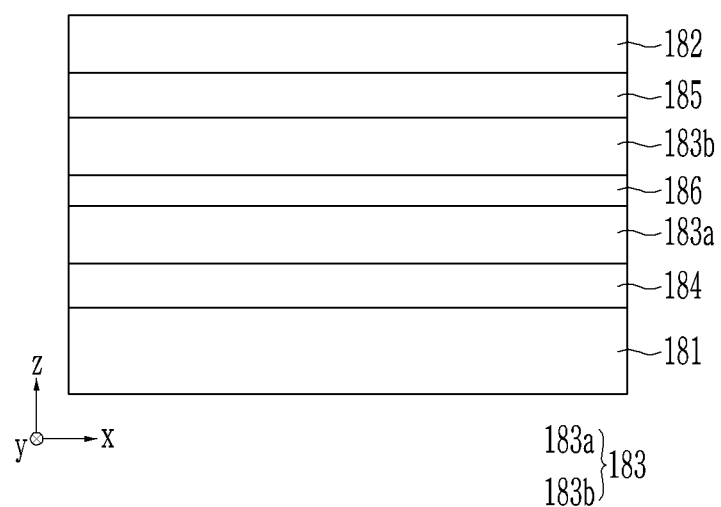

Referring to FIG. 6, the light emitting element 180 may have a tandem structure, and may include a first electrode 181 and a second electrode 182 facing each other; a first light emitting layer 183a and a second light emitting layer 183b between the first electrode 181 and the second electrode 182; a charge generation layer 186 between the first light emitting layer 183a and the second light emitting layer 183b, and optionally auxiliary layers 184 and 185 between the first electrode 181 and the first light emitting layer 183a and between the second electrode 182 and the second light emitting layer 183b.

The first electrode 181, the second electrode 182, and the auxiliary layers 184 and 185 may be similar to those described above.

The first light emitting layer 183a and the second light emitting layer 183b may emit light having the same or different emission spectrum, and, for example, each may emit light of a blue emission spectrum. Detailed descriptions may be similar to the light emitting layer 183 described above.

The charge generation layer 186 may inject electric charges into the first light emitting layer 183a and/or the second light emitting layer 183b, and may control a charge balance between the first light emitting layer 183a and the second light emitting layer 183b. The charge generation layer 186 may include, for example, an n-type layer and a p-type layer, and may include, for example, an electron transport material and/or a hole transport material including an n-type dopant and/or a p-type dopant. The charge generation layer 186 may be one layer or two or more layers.

Figure 7:
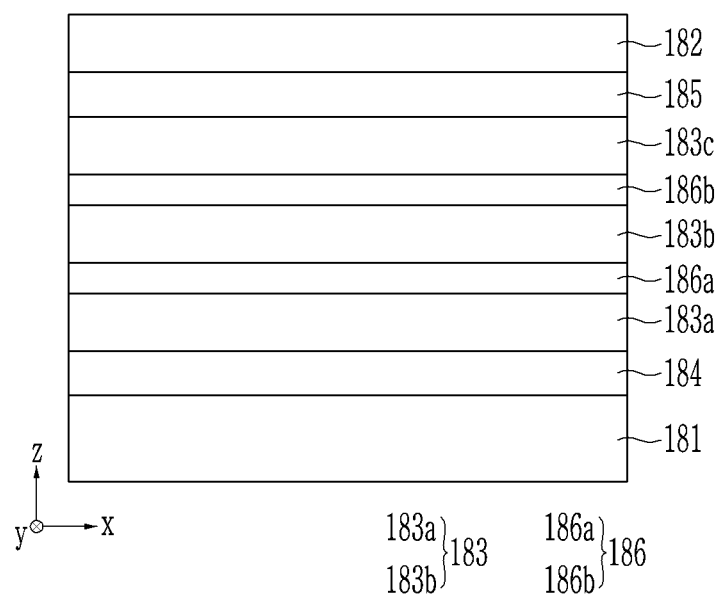

Referring to FIG. 7, the light emitting element 180 may have a tandem structure, and may include a first electrode 181 and a second electrode 182 facing each other; a first light emitting layer 183a, a second light emitting layer 183b, and a third light emitting layer 183c between the first electrode 181 and the second electrode 182; a first charge generation layer 186a between the first light emitting layer 183a and the second light emitting layer 183b; a second charge generation layer 186b between the second light emitting layer 183b and the third light emitting layer 183c; and optionally, auxiliary layers 184 and 185 between the first electrode 181 and the first light emitting layer 183a and between the second electrode 182 and the third light emitting layer 183c.

The first electrode 181, the second electrode 182, and the auxiliary layers 184 and 185 may be similar to those described above.

The first light emitting layer 183a, the second light emitting layer 183b, and the third light emitting layer 183c may emit light of the same or different emission spectrum, and, for example, each may emit light of a blue emission spectrum. Detailed descriptions may be similar to the light emitting layer 183 described above.

The first charge generation layer 186a may inject electric charges into the first light emitting layer 183a and/or the second light emitting layer 183b, and may control charge balances between the first light emitting layer 183a and the second light emitting layer 183b. The second charge generation layer 186b may inject electric charges into the second light emitting layer 183b and/or the third light emitting layer 183c, and may control charge balances between the second light emitting layer 183b and the third light emitting layer 183c. Each of the first and second charge generation layers 186a and 186b may be one layer or two or more layers.

Figure 8:
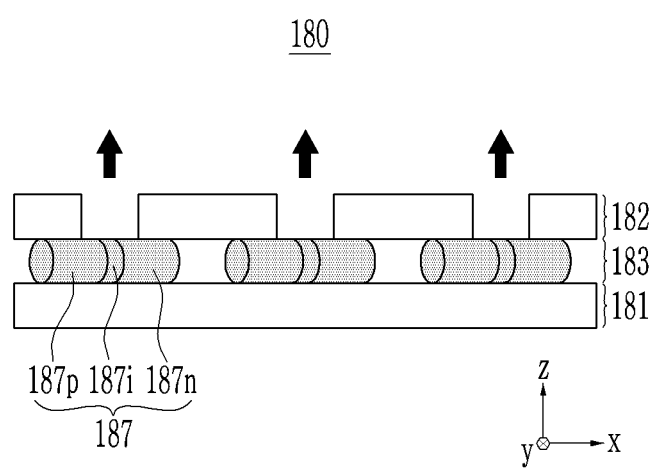

Referring to FIG. 8, the light emitting element 180 may include a first electrode 181, a second electrode 182, and a light emitting layer 183 including a plurality of nanostructures 187.

One selected from the first electrode 181 and the second electrode 182 may be an anode and the other may be a cathode. The first electrode 181 and the second electrode 182 may be electrodes patterned according to arrangement directions of the plurality of nanostructures 187, and may include, for example, conductive oxides such as indium tin oxide ITO, indium zinc oxide IZO, zinc oxide ZnO, tin oxide SnO, aluminum tin oxide AlTO, and fluorine-doped tin oxide FTO; silver Ag, copper Cu, aluminum Al, gold Au, titanium Ti, chromium Cr, nickel Ni, an alloy thereof, a nitride thereof (e.g., TiN); or a combination thereof, but are not limited thereto.

The light emitting layer 183 may include a plurality of nanostructures 187, and each of the sub-pixels $PX_1$, $PX_2$, and $PX_3$ may include a plurality of nanostructures 187. The plurality of nanostructures 187 may be arranged along one direction, but the present disclosure is not limited thereto. The nanostructures 187 may be a compound semiconductor to emit light of a set or predetermined wavelength spectrum when an electric current is applied, and may be, for example, linear nanostructures such as nanorods and/or nanoneedles. The diameter or long diameter of the nanostructures 187 may be, for example, several to several hundreds of nanometers, and aspect ratios of the nanostructures 187 may be greater than about 1, greater than or equal to about 1.5, greater than or equal to about 2.0, greater than or equal to about 3.0, greater than or equal to about 4.0, greater than or equal to about 4.5, greater than or equal to about 5.0; about 1 to and less than or equal to about 20, about 1.5 to about 20, about 2.0 to about 20, about 3.0 to about 20, about 4.0 to about 20, about 4.5 to about 20, or about 5.0 to about 20.

Each of the nanostructures 187 may include a p-type region 187$p$, an n-type region 187$n$, and a multiple quantum well region 187$i$, and may emit light from the multiple quantum well region 187$i$. The nanostructures 187 may include, for example, gallium nitride GaN, indium gallium nitride InGaN, aluminum gallium nitride AlGaN, or a combination thereof, and may have, for example, a core-shell structure.

The plurality of nanostructures 187 may emit light of the same emission spectrum with each other, and may emit light of a blue emission spectrum, for example, light of a blue emission spectrum having a maximum emission wavelength in a wavelength region of greater than or equal to about 400 nm and less than about 500 nm, about 410 nm to about 490 nm, or about 420 nm to about 480 nm.

Referring to FIGS. 1 to 4, the encapsulation layer 190 may cover the light emitting element 180 and include a glass plate, a metal thin film, an organic film, an inorganic film, an organic-inorganic film, or a combination thereof. The organic film may include, for example, an acrylic resin, a (meth)acrylic resin, polyisoprene, a vinyl resin, an epoxy resin, a urethane resin, a cellulose resin, a perylene resin, or a combination thereof, but is not limited thereto. The inorganic film may include, for example, an oxide, a nitride, and/or an oxynitride, for example silicon oxide, silicon nitride, silicon oxynitride, aluminum oxide, aluminum nitride, aluminum oxynitride, zirconium oxide, zirconium nitride, zirconium oxynitride, titanium oxide, titanium nitride, titanium oxynitride, hafnium oxide, hafnium nitride, hafnium oxynitride, tantalum oxide, tantalum nitride, tantalum oxynitride, lithium fluoride, or a combination thereof, but is not limited thereto. The organic-inorganic film may include, for example, polyorganosiloxane, but is not limited thereto. The encapsulation layer 190 may be one or two or more layers.

The color conversion panel 200 may convert the light of the first emission spectrum supplied from the light emitting panel 100 into light of a second or third emission spectrum different from the first emission spectrum and emit the converted light to an observer. For example, the color conversion panel 200 may include the upper substrate 210, the light blocking pattern 220, the color filter layer 230, the planarization layer 240, the bank 250, the color conversion layer 270, and the encapsulation layer 290.

The upper substrate 210 may be a glass substrate and/or a polymer substrate. The polymer substrate may include, for example, polyimide, polyamide, polyamideimide, polyethylene terephthalate, polyethylene naphthalene, polymethyl methacrylate, polycarbonate, a copolymer thereof, or a combination thereof, but is not limited thereto.

The color conversion layer 270 may face the light emitting element 180 of the light emitting panel 100. The color conversion layer 270 may include at least one color conversion region to convert an emission spectrum of light supplied from the light emitting panel 100 into other emission spectrum, and the color conversion region may, for example, convert light in the emission spectrum supplied from the light emitting panel 100 into light in the emission spectrum of the color displayed by each of the sub-pixels $PX_1$, $PX_2$, and $PX_3$.

The color conversion region may include a color converting element to convert the emission spectrum of light supplied from the light emitting panel 100 into other emission spectrum, and may include, for example, a quantum dot, a phosphor, or a combination thereof as a color converting element. For example, the color converting element may be a quantum dot.

The quantum dot may mean semiconductor nanocrystals in a broad sense, and may have a photoluminescence characteristic of receiving light of a set or predetermined emission spectrum and then emitting light of a longer wavelength spectrum. Because the quantum dot may have isotropic light emission characteristics, they may emit light in all directions (e.g., substantially all directions), thus exhibiting an improved wide viewing angle.

The quantum dot may have various shapes, such as spherical, pyramidal, multi-arm, cubic, quantum rod, and/or quantum plate. Herein, the quantum rod may mean a quantum dot having an aspect ratio of greater than 1, for example, an aspect ratio of greater than or equal to about 2, greater than or equal to about 3, or greater than or equal to about 5. For example, the aspect ratio of the quantum rod may be less than or equal to about 50, less than or equal to about 30, or less than or equal to about 20. The quantum dot may have, for example a particle diameter (an average largest particle diameter for a non-spherical shape) of about 1 nm to about 100 nm, for example about 1 nm to about 80 nm, for example about 1 nm to about 50 nm, for example about 1 nm to 20 nm.

An energy bandgap of the quantum dot may be adjusted according to sizes and/or compositions, and the emission wavelength may be adjusted accordingly. For example, as the size of the quantum dot is larger, the energy bandgap may be narrower, and thus, light of a relatively long wavelength spectrum may be emitted. For example, the diameter of the quantum dot may be about 1 nm to about 10 nm.

For example, the quantum dot may emit light of a set or predetermined wavelength spectrum among, for example, a visible wavelength spectrum according to a size and/or a composition. For example, the quantum dot may selectively emit one of light in the red emission spectrum, light in the green emission spectrum, and light in the blue emission spectrum. Light in the red emission spectrum may have a maximum emission wavelength in, for example, about 520 nm to about 560 nm, and light in the blue emission spectrum may have a maximum emission wavelength in, for example, about 420 nm to about 480 nm. For example, by including two or more types of quantum dots having different sizes and/or compositions, light having a plurality of wavelength spectrums may be emitted. For example, two or more types of quantum dots of different sizes and/or compositions may be blended or stacked to emit white light.

The quantum dot may have a relatively narrow full width at half maximum (FWHM). Herein, the FWHM may be a width of a wavelength corresponding to a half of a peak absorption point, and as the FWHM is narrower, light in a narrower wavelength region may be emitted and high color purity may be obtained. The quantum dot may have for example a FWHM of less than or equal to about 50 nm, within the range, less than or equal to about 45 nm, less than or equal to about 40 nm, less than or equal to about 35 nm, less than or equal to about 30 nm, or less than or equal to about 28 nm, within the range about 3 nm to about 50 nm, about 3 nm to about 45 nm, about 3 nm to about 40 nm, about 3 nm to about 35 nm, about 3 nm to about 30 nm, or about 3 nm to about 28 nm. As such, the quantum dot may have a relatively narrow FWHM, so that good color purity and/or color reproducibility may be implemented.

The quantum dot may be synthesized by, for example, a wet chemical process, metal organic chemical vapor deposition (MOCVD), molecular beam epitaxy (MBE), and/or a similar process.

The wet chemical process is, for example, a method of growing quantum dot particle crystals after blending an organic solvent and a precursor material. The wet chemical process may be inexpensive and may be used more effectively than vapor deposition methods such as metal organic chemical vapor deposition or molecular beam epitaxy because the organic solvent naturally acts as a dispersant coordinated on the surfaces of the quantum dot crystals and controls crystal growth when the quantum dot particle crystal grows.

For example, the quantum dot may include a Group II-VI semiconductor compound, a Group III-V semiconductor compound, a Group III-VI semiconductor compound, a Group IV-VI semiconductor compound, a Group IV element or semiconductor compound, a Group I-III-VI semiconductor compound, a Group I-II-IV-VI semiconductor compound, a Group II-III-V semiconductor compound, or a combination thereof.

The Group II-VI semiconductor compounds may include, for example, a binary semiconductor compound selected from CdS, CdSe, CdTe, ZnS, ZnSe, ZnTe, ZnO, HgS, HgSe, HgTe, MgSe, MgS, and a mixture thereof; a ternary element compound selected from CdSeS, CdSeTe, CdSTe, ZnSeS, ZnSeTe, ZnSTe, HgSeS, HgSeTe, HgSTe, HgZnS, HgZnSe, HgZnTe, MgZnSe, MgZnS, CdZnS, CdZnSe, CdZnTe, CdHgS, CdHgSe, CdHgTe, and a mixture thereof; and a quaternary element compound selected from CdZnSeS, CdZnSeTe, CdZnSTe, CdHgSeS, CdHgSeTe, CdHgSTe, HgZnTeS, HgZnSeS, HgZnSeTe, HgZnSTe, and a mixture thereof; or a combination thereof, but is not limited thereto.

The Group III-V semiconductor compound may include, for example, a binary semiconductor compound selected from GaN, GaP, GaAs, GaSb, AlN, AlP, AlAs, AlSb, InN, InP, InAs, InSb, and a mixture thereof; a ternary element compound selected from GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and a mixture thereof; and a quaternary element compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof, but is not limited thereto. The Group III-V semiconductor compound may further include a Group II element. The Group III-V semiconductor compound further including a Group II element may include, for example, InZnP, InGaZnP, InAlZnP, or a combination thereof.

The Group III-VI semiconductor compound may include, for example, a binary semiconductor compound selected from GaS, GaSe, Ga2Se3, GaTe, InS, InSe, In2Se3, InTe, and a mixture thereof; a ternary element compound selected from $nGaS_3$, $InGaSe_3$ and a mixture thereof; or a combination thereof.

The Group IV-VI semiconductor compound may include, for example, a binary semiconductor compound selected from SnS, SnSe, SnTe, PbS, PbSe, PbTe, and a mixture thereof; a ternary element compound selected from SnSeS, SnSeTe, SnSTe, PbSeS, PbSeTe, PbSTe, SnPbS, SnPbSe, SnPbTe, and a mixture thereof; and a quaternary element compound selected from SnPbSSe, SnPbSeTe, SnPbSTe, and a mixture thereof, but is not limited thereto.

The Group IV element or semiconductor compound may include, for example, a single element semiconductor selected from Si, Ge, and a mixture thereof; a binary semiconductor compound selected from SiC, SiGe, and a mixture thereof; or a combination of these, but is not limited thereto.

The Group I-III-VI semiconductor compound may be, for example, selected from AgInS, $AgInS_2$, CuInS, $CuInS_2$, $CuInSe_2$, CuInGaSe, CuInGaS, $CuGaO_2$, $AgGaO_2$, $AgAlO_2$, and a mixture thereof, but is not limited thereto.

The Group I-II-IV-VI semiconductor compound may be, for example, CuZnSnSe, CuZnSnS, or a combination thereof, but is not limited thereto.

The Group II-III-V semiconductor compound may include, for example, InZnP, but is not limited thereto.

The quantum dot may include the single element semiconductor, the binary element compound, the ternary element compound, or the quaternary element compound in a substantially uniform concentration or partially different concentration distributions.

For example, the quantum dot may be a semiconductor compound including indium (In), and at least one of zinc (Zn), and phosphorus (P), for example, an In—P semiconductor compound and/or an In—Zn—P semiconductor compound. For example, the quantum dot may be a semiconductor compound including zinc (Zn) and one selected from tellurium (Te) and selenium (Se), for example, a Zn—Te semiconductor compound, a Zn—Se semiconductor compound, and/or a Zn—Te—Se semiconductor compound.

The quantum dot may have a single structure or a core-shell structure in which the concentration of each element included in the corresponding quantum dot is uniform (e.g., substantially uniform).

For example, the quantum dot may have a core-shell structure in which one quantum dot surrounds another quantum dot. The shell of the quantum dot may be, for example, a protective layer for preventing or reducing chemical modification of the quantum dot core or a charging layer for imparting electrophoretic properties to the quantum dot.

The shell of the quantum dot may include, for example, a metal or non-metal oxide, a semiconductor compound, or a combination thereof. Examples of the metal or non-metal oxide may include a binary compound selected from $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and a mixture thereof; a ternary compound selected from $MgAl_2O_4$, $CoFe_2O_4$, $NiFe_2O_4$, $CoMn_2O_4$, and a mixture thereof; or a combination thereof. Examples of the semiconductor compound may include the aforementioned Group II-VI semiconductor compound, Group III-V semiconductor compound, Group III-VI semiconductor compound, Group IV-VI semiconductor compound, Group IV element or semiconductor compound, Group I-III-VI semiconductor compound, Group I-II-IV-VI semiconductor compound, Group II-III-V semiconductor compound, or combination thereof, for example, CdS, CdSe, CdTe, ZnS, ZnSe, ZnTe, ZnSeS, ZnTeS GaAs, GaP, GaSb, HgS, HgSe, HgTe, InAs, InP, InGaP, InSb, AlAs, AlP, AlSb, or a combination thereof.

For example, an interface between the core and the shell of the quantum dot may have a concentration gradient in which the concentration of an element present in the shell decreases along a direction toward the center. For example, a material composition constituting a shell of a quantum dot may have a higher energy band gap than a material composition constituting a core of a quantum dot, and thus, may have a quantum confinement effect. The quantum dot may include one quantum dot core and a multi-layered quantum dot shell surrounding it. In this case, the multi-layered shell has two or more shells, and each layer may independently have a single composition, an alloy, and/or a concentration gradient. For example, among the multi-layered shells, a shell farther from the core may have a higher energy band gap than a shell closer to the core, thereby having a quantum confinement effect.

As an example, the quantum dot may include a cadmium-free quantum dot. The cadmium-free quantum dot is a quantum dot that does not include cadmium (Cd). Cadmium (Cd) may cause severe environment/health problems and is a restricted element by Restriction of Hazardous Substances Directive (RoHS) in a plurality of countries, and thus the non-cadmium-based quantum dot may be effectively used.

The color conversion region may convert light supplied from the light emitting panel 100 into light of a wavelength spectrum of a color displayed by each of the sub-pixels $PX_1$, $PX_2$, and $PX_3$, and then may emit the displayed by each of the sub-pixels $PX_1$, $PX_2$, and $PX_3$, and accordingly, the quantum dots included in each color conversion region may be different from each other.

Referring to FIG. 4, at least a portion of the color conversion layer 270 may include quantum dots. For example, the color conversion layer 270 may include a first color conversion region 270a included in the first sub-pixel $PX_1$ and including first quantum dots 271a, a second color conversion region 270b included in the second sub-pixel $PX_2$ and including second quantum dots 271b, and a light transmitting region 270c.

The first quantum dots 271a included in the first color conversion region 270a may convert light of the first emission spectrum emitted from the light emitting panel 100 into light of the second emission spectrum that may be the same as the wavelength spectrum of the color displayed by the first sub-pixel $PX_1$. The second emission spectrum may be different from the first emission spectrum and may be a longer wavelength spectrum than the first emission spectrum.

The second quantum dots 271b included in the second color conversion area 270b may convert light of the first emission spectrum emitted from the light emitting panel 100 into light of the third emission spectrum that may be the same as the wavelength spectrum of the color displayed by the second sub-pixel $PX_2$. The third emission spectrum may be different from the first and second emission spectra, respectively, and may be a longer wavelength spectrum than the first emission spectrum.

For example, when the light emitting element 180 of the light emitting panel 100 may emit light of a blue emission spectrum, and the first sub-pixel $PX_1$, the second sub-pixel $PX_2$, and the third sub-pixel $PX_3$ respectively display red, green, and blue, the first quantum dot 271a included in the first color conversion region 270a may convert the light of the blue emission spectrum into light of the red emission spectrum, and the second quantum dot 271b included in the second color conversion region 270b may convert the light of the blue emission spectrum into light of the green emission spectrum. Herein, because the first quantum dot 271a may emit light of a longer wavelength spectrum than that of the second quantum dot 271b, the first quantum dot 271a may have a larger size than that of the second quantum dot 271b. The blue displayed in the third sub-pixel $PX_3$ may be displayed by the light of the blue emission spectrum emitted from the light emitting element 180 of the light emitting panel 100 and thus displayed through the light transmitting region 270c without a separate color converting element (e.g. a quantum dot) in the third sub-pixel $PX_3$. However, in some embodiments, the third sub-pixel $PX_3$ may further include the color converting element such as a quantum dot to emit light of the blue emission spectrum.

The first color conversion region 270a, the second color conversion region 270b, and the light transmitting region 270c may further include scattering particles 272a, 272b, and 272c. The scattering particles 272a, 272b, and 272c may be scatter and/or reflect light emitted from the quantum dots 271a and 271b and/or the light emitting element 180 of the light emitting panel 100, and thus lead it to a color filter layer 230. For example, the scattering particles 272a, 272b, and 272c may scatter and/or reflect light in various suitable directions regardless of the incident angle without substantially changing a wavelength of the light emitted from the quantum dots 271a and 271b and/or the light emitting element 180 of the light emitting panel 100 and accordingly, improve side visibility of a display panel. The scattering particles 272a, 272b, and 272c may be low refractive index nanoparticles and, for example, include a metal and/or semi-metal oxide such as a silicon oxide, a titanium oxide, a zirconium oxide, an aluminum oxide, an indium oxide, a zinc oxide, a tin oxide, or a combination thereof; an organic material such as an acrylic resin, a urethane resin, and/or a combination thereof; or a combination thereof, but is not limited thereto.

The first color conversion region 270a, the second color conversion region 270b, and the light transmitting region 270c may further include light transmitting resins 273a, 273b, and 273c, respectively. The light transmitting resins 273a, 273b, and 273c may be dispersive media to disperse the quantum dots 271a and 271b and/or the scattering particles 272a, 272b, and 272c, and, for example, may include an acrylic resin, a urethane resin, a silicone resin, an epoxy resin, a cardo-based resin, an imide resin, a derivative thereof, or a combination thereof, but is not limited thereto.

A bank 250 may define each region of the color conversion layer 270 and be between adjacent regions. For example, the bank 250 may respectively define the aforementioned first and second color conversion regions 270a and 270b and light transmitting region 270c and may be between the adjacent first and second color conversion regions 270a and 270b, between the second color conversion region 270b and the light transmitting region 270c which may be neighboring each other (e.g. adjacent to each other, or next to each other), and may be between the first color conversion region 270a and the light transmitting region 270c, which may be neighboring (e.g. adjacent to, or next to) each other in some embodiments (or would otherwise be neighboring, adjacent to, or next to each other if the second color conversion region 270b was omitted). The bank 250 may provide a space to which a composition for the color conversion layer 270 may be supplied and concurrently (e.g., simultaneously), prevent each composition for the first color conversion region 270a, the second color conversion region 270b, and the light transmitting region 270c from overflowing (or reduce such overflowing) into each neighboring first color conversion region 270a, second color conversion region 270b, and light transmitting region 270c during the process of forming the first color conversion region 270a, the second color conversion region 270b, and the light transmitting region 270c.

The bank 250 may directly contact (e.g., physically contact) the first color conversion region 270a, the second color conversion region 270b, and the light transmitting region 270c without a separate layer between the bank 250 and the first color conversion region 270a, between the bank 250 and the second color conversion region 270b, and between the bank 250 and the light transmitting region 270c.

On the other hand, as described above, because quantum dots may emit light in all directions (e.g., substantially all directions) due to the isotropic light emission characteristics, light emitted from the first and second quantum dots 271a and 271b may spread all directions (e.g., substantially all directions) and reach the bank 250 defining the first and second color conversion regions 270a and 270b. Accordingly, the light reaching the bank 250 may not be absorbed in the bank 250 but may be scattered and/or reflected by the bank 250 to lead the light toward the upper substrate 210 and thus increase light efficiency and/or light conversion efficiency without light loss. A refractive index of the bank 250 may be smaller than that of the quantum dots, and accordingly, the light reaching the bank 250 may be fully reflected (e.g. more fully reflected).

Likewise, light emitted from the light emitting element 180 of the light emitting panel 100 and light passing the light transmitting region 270c also may not be absorbed in the bank 250 but may be scattered and/or reflected by the bank 250 and then, led toward the upper substrate 210, increasing light efficiency without light loss (e.g. reduced light loss). The refractive index of the bank 250 may be smaller than that of a light emitter included in the light emitting element 180, and accordingly, the light reaching the bank 250 may be fully reflected (e.g. more fully reflected).

In one or more embodiments, the refractive index of the bank 250 at wavelengths belonging to the first, second, and third emission spectra may be smaller than that of the quantum dots at each same wavelength. Accordingly, light of the second emission spectrum emitted from the first quantum dot 271a in the first color conversion region 270a, light of the third emission spectrum emitted from the second quantum dot 271b in the second color conversion region 270b, and light of the first emission spectrum emitted from the light emitting element 180 of the light emitting panel 100 may be respectively prevented from being lost (or such loss may be reduced), but may be effectively scattered and/or reflected toward the upper substrate 210 by the bank 250.

For example, each refractive index of the bank 250 at wavelengths belonging to the first, second, and third emission spectra may be smaller than that of the quantum dots at each same wavelength by an amount greater than or equal to about 0.2, greater than or equal to about 0.3, greater than or equal to about 0.4, or greater than or equal to about 0.5, or an amount of about 0.2 to about 0.8, about 0.3 to about 0.8, about 0.4 to about 0.8, or about 0.5 to about 0.8.

For example, the refractive index at a wavelength belonging to the second emission spectrum of the first quantum dot 271a in the first color conversion region 270a may be about 1.6 to about 2.0, about 1.6 to about 1.9, or about 1.6 to about 1.8.

For example, the refractive index at a wavelength belonging to the third emission spectrum of the second quantum dot 271b in the second color conversion region 270b may be about 1.6 to about 2.0, about 1.6 to about 1.9, or about 1.6 to about 1.8.

For example, the refractive index at a wavelength belonging to the first emission spectrum of a light emitter included in the light emitting element 180 in the light emitting panel 100 may be about 1.6 to about 2.0, about 1.6 to about 1.9, or about 1.6 to about 1.8.

For example, when the first, second, and third emission spectra are respectively blue, red, and green emission spectra, a refractive index of the first quantum dot 271a at a wavelength of about 630 nm, a refractive index of the second quantum dot 271b at a wavelength of about 550 nm, and a refractive index of the light emitter of the light emitting element 180 at a wavelength of about 460 nm may be respectively about 1.6 to about 2.0, about 1.6 to about 1.9, or about 1.6 to about 1.8.

For example, the refractive index of the bank 250 at each wavelength belonging to the first, second, and third emission spectrum may be about 1.1 to about 1.4 and within the range, about 1.2 to about 1.4.

For example, each refractive index of the bank 250 at wavelengths of about 460 nm, about 550 nm, and about 630 nm may be about 1.1 to about 1.4 and within the range, about 1.2 to about 1.4.

The bank 250 may be a transflective bank having the aforementioned refractive index characteristics.

The bank 250 may have a light transmittance of less than about 80% (with reference to a thickness of about 1 μm), less than or equal to about 75%, less than or equal to about 70%, less than or equal to about 65%, less than or equal to about 60%, less than or equal to about 55%, greater than or equal to about 10%, greater than or equal to about 20%, greater than or equal to about 30%, greater than or equal to about 40%, or greater than or equal to about 45%. The bank 250 may have, for example, a light transmittance of about 10% to about 75%, about 10% to about 70%, about 20% to about 70%, about 30% to about 70%, about 40% to about 60%, or about 45% to about 55%.

The bank 250 may include a blended pigment and a scatterer in order to satisfy the transflective characteristics.

The blended pigment may include two or more pigments having different absorption spectra in the visible wavelength region, for example, at least two pigments selected from among a first pigment having a maximum absorption wavelength in a range of greater than or equal to about 380 nm and less than about 500 nm, a second pigment having a maximum absorption wavelength in a range of about 500 nm to about 600 nm, and a third pigment having a maximum absorption wavelength in a range of greater than about 600 nm and less than or equal to about 780 nm. The first, second, and third pigments respectively may include one, two, or more. For example, the blended pigment may be a mixture of the first pigment and the second pigment. For example, the blended pigment may be a mixture of the first pigment and the third pigment. For example, the blended pigment may be a mixture of the second pigment and the third pigment. For example, the blended pigment may be a mixture of the first pigment, the second pigment, and the third pigment. The blended pigment may be included in an amount of about 1 wt % to about 50 wt % (weight percent) (based on a solid content) with respect to the bank 250, about 5 wt % to about 40 wt % or about 5 wt % to about 30 wt %.

The scatterer may be an inorganic scatterer, an organic scatterer, an organic/inorganic scatterer, or a combination thereof, for example, scattering particles. The scatterers may include, for example, silicon oxide, zinc oxide, titanium oxide, tantalum oxide, niobium oxide, tin oxide, magnesium oxide, nanosilicate, calcium carbonate, calcium fluoride, porogen, or a combination thereof. The scatterers may be included in an amount of about 1 wt % to about 20 wt % (based on a solid content) with respect to the bank 250, about 3 wt % to about 15 wt % or about 5 wt % to about 10 wt %.

The bank 250 may have relatively high optical density in at least two regions out of the wavelength regions of greater than or equal to about 380 nm and less than about 500 nm, about 500 nm to about 600 nm, and greater than about 600 nm and less than or equal to about 780 nm; for example, the optical density may be greater than or equal to about 0.1, greater than or equal to about 0.2, or greater than or equal to about 0.3 and less than or equal to about 0.8, less than or equal to about 0.7, or less than or equal to about 0.6; for example, about 0.1 to about 0.8, about 0.1 to about 0.7, about 0.1 to about 0.6, about 0.2 to about 0.8, about 0.2 to about 0.7, about 0.2 to about 0.6, about 0.3 to about 0.8, about 0.3 to about 0.7, or about 0.3 to about 0.6 in at least two regions out of the wavelength regions. For example, the bank 250 may have the disclosed optical density in each wavelength region.

The bank 250 may further include a light transmitting resin in addition to the blended pigment and the scatterer. The light transmitting resin may be a dispersion medium dispersing the pigment and the scatterer and, for example, may include an acrylic resin, a urethane resin, a silicone resin, an epoxy resin, a cardo-based resin, an imide resin, a derivative thereof, or a combination thereof, but is not limited thereto. The light transmitting resin may be included in an amount excluding the blended pigment and the scatterer.

In the drawings, the bank 250 may be exemplarily shown as one column-shaped with the same width, but is not limited thereto and may have various sizes and shapes. For example, the bank 250 may have a trapezoid cross-section shape.

The color filter layer 230 may be positioned in a direction in which light passing through the color conversion layer 270 may be emitted. The color filter layer 230 may include color filters 230a, 230b, and 230c in each sub-pixel PX$_1$, PX$_2$, and PX$_3$ and selectively transmit light of different wavelength spectra. The color filters 230a, 230b, and 230c may selectively transmit light of each same wavelength spectrum as the color displayed in each sub-pixel PX$_1$, PX$_2$, and PX$_3$ and also, selectively transmit light of the emission spectrum converted in each region of the color conversion layer 270.

For example, the first sub-pixel PX$_1$, the second sub-pixel PX$_2$, and the third sub-pixel PX$_3$ respectively may display red, green, and blue, and when light of each red emission spectrum, green emission spectrum, and blue emission spectrum may be emitted from the first color conversion region 270a, the second color conversion region 270b, and the light transmitting region 270c, the first color filter 230a overlapped with the first color conversion region 270a may be a red filter, the second color filter 230b overlapped with the second color conversion region 270b may be a green filter, and the third color filter 230c overlapped with the light transmitting region 270c may be a blue filter. The first color filter 230a, the second color filter 230b, or the third color filter 230c may include a pigment and/or a dye to selectively transmit light of a red wavelength spectrum, a green wavelength spectrum, or a blue wavelength spectrum but absorb and/or reflect light of the other wavelength spectra.

The color filter layer 230 may more precisely filter light emitted from the color conversion layer 270 and thus enhance color purity of the light emitted toward the upper substrate 210. For example, the first color filter 230a overlapped with the first color conversion region 270a may block (or reduce transmission of) light not converted and transmitted by the first quantum dot 271a of the first color conversion region 270a and, for example, enhance color purity of light of the red emission spectrum. For example, the second color filter 230b overlapped with the second color conversion region 270b may block (or reduce transmission of) light not converted by but transmitted by the first quantum dot 271b of the second color conversion region 270b and, for example, enhance color purity of light of the green emission spectrum. For example, the third color filter 230c overlapped with the second color conversion region 270c may be configured to block (or reduce transmission of) light other than light of the blue emission spectrum and, for example, enhance color purity of light of the blue emission spectrum. For example, at least some of the first, second, and third color filters 230a, 230b, and 230c may be omitted, for example, the third color filter 230c overlapped with the light transmitting region 270c may be omitted.

The light blocking pattern 220 may define each sub-pixel PX$_1$, PX$_2$, and PX$_3$ and be between the neighboring sub-pixels PX$_1$, PX$_2$, and PX$_3$. The light blocking pattern 220 may be, for example, a black matrix. The light blocking pattern 220 may be overlapped with the edges of the neighboring color filters 230a, 230b, and 230c.

The planarization layer 240 may be between the color filter layer 230 and the color conversion layer 270, and may reduce or eliminate a step difference caused by the color filter layer 230. The planarization layer 240 may include an organic material, an inorganic material, an organic-inorganic material, or a combination thereof. The planarization layer 240 may include, for example, an oxide, a nitride, and/or an oxynitride, for example, silicon oxide, silicon nitride, silicon oxynitride, or a combination thereof, but is not limited thereto. The planarization layer 240 may be one layer or two or more layers, and may cover the entire surface of the upper substrate 210.

The encapsulation layer 290 may cover the color conversion layer 270 and the bank 250, and may include a glass plate, a metal thin film, an organic film, an inorganic film, an organic-inorganic film, or a combination thereof. The organic film may include, for example, an acrylic resin, a (meth)acrylic resin, polyisoprene, a vinyl resin, an epoxy resin, an urethane resin, a cellulose resin, a perylene resin, and/or a combination thereof, but is not limited thereto. The inorganic film may include, for example, an oxide, a nitride, and/or an oxynitride, for example silicon oxide, silicon nitride, silicon oxynitride, aluminum oxide, aluminum nitride, aluminum oxynitride, zirconium oxide, zirconium nitride, zirconium oxynitride, titanium oxide, titanium nitride, titanium oxynitride, hafnium oxide, hafnium nitride, hafnium oxynitride, tantalum oxide, tantalum nitride, tantalum oxynitride, lithium fluoride, or a combination thereof, but is not limited thereto. The organic-inorganic film may include, for example, polyorganosiloxane, but is not limited thereto. The encapsulation layer 290 may be one, two, or more layers.

A light transmitting layer 300 may be between the light emitting panel 100 and the color conversion panel 200. The light transmitting layer 300 may include, for example, a filling material. The light transmitting layer 300 may include an organic material, an inorganic material, an organic-inorganic material, or a combination thereof, and may include, for example, an epoxy resin, a silicone compound, a polyorganosiloxane, or a combination thereof.

Hereinafter, a display panel according to one or more embodiments is described.

Figure 9:
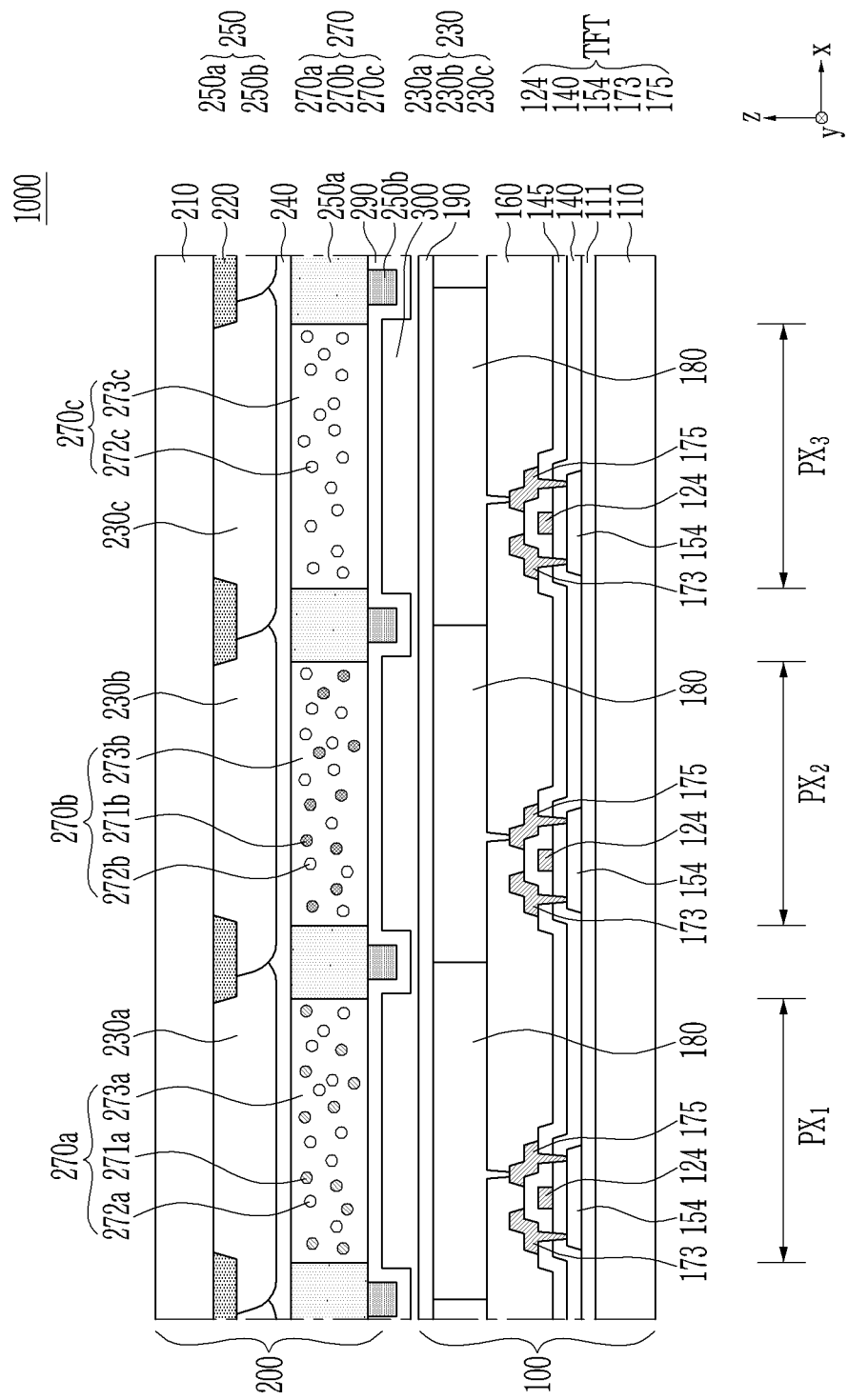
FIG. 9 is a cross-sectional view illustrating another example of the display panel illustrated in FIGS. 1 to 3.

FIG. 9 is a cross-sectional view illustrating another example of the display panel illustrated in FIGS. 1 to 3.

Referring to FIG. 9, a display panel 1000 according to the present embodiment may include a light emitting panel 100, a color conversion panel 200, a light transmitting layer 300 between the light emitting panel 100 and the color conversion panel 200, and a binding element 400 combining the light emitting panel 100 and the color conversion panel 200. The light emitting panel 100 may include a lower substrate 110, a buffer layer 111, a thin film transistor (TFT), a light emitting element 180, and an encapsulation layer 190, and the color conversion panel 200 may include an upper substrate 210, a light blocking pattern 220, a color filter layer 230, a planarization layer 240, a bank 250, a color conversion layer 270, and an encapsulation layer 290.

However, the display panel 1000 according to one or more embodiments may include a first bank 250a and a second bank 250b.

The first bank 250a may be the same as the bank 250 in the above embodiment and define a plurality of regions of the color conversion layer 270, for example, between the neighboring first and second color conversion regions 270a and 270b, between the neighboring second color conversion region 270b and the light transmitting region 270c, and, in some embodiments, between the neighboring first color conversion region 270a and the light transmitting region 270c (or that would otherwise be neighboring, adjacent to, or next to each if the second color conversion region 270b was omitted).

The second bank 250b may be protruded toward the light emitting panel 100, for example, between the light emitting panel 100 and the color conversion panel 200. The second bank 250b may be between the light emitting panel 100 and the color conversion panel 200 and may act as a spacer keeping a gap between the light emitting panel 100 and the color conversion panel 200. A height of the spacer 310 may be equal to or smaller than the gap between the light emitting panel 100 and the color conversion panel 200. A width of the second bank 250b may be smaller than that of the first bank 250a, and accordingly, the first bank 250a and the second bank 250b may have a stepwise shape.

The second bank 250b may be connected to the first bank 250a or separated from the first bank 250b. In the drawings, the first bank 250a and the second bank 250b may be connected each other, and an encapsulation layer 290 may be formed under the second bank 250b, but the present disclosure is not limited thereto, and the first bank 250a and the second bank 250b may be separated by the encapsulation layer 290.

For example, the first bank 250a and the second bank 250b may be made of different materials.

The first bank 250a and the second bank 250b may have different surface characteristics, for example, a surface of the first bank 250a may be hydrophilic, while a surface of the second bank 250b may be hydrophobic. Accordingly, when the color conversion layer 270 is, for example, formed through a solution process such as an Inkjet process, liquid repellency characteristics of the bank 250 may be supplemented to effectively prevent a composition for the first color conversion region 270a, a composition for the second color conversion region 270b, and a composition for the light transmitting region 270c from flowing into the adjacent compartment (or may effectively reduce such flow). For example, the second bank 250b may include a fluorine-containing compound, a fluorine-containing polymer, or a combination thereof, but is not limited thereto.

Hereinafter, a display panel according to one or more embodiments is described.

Figure 10:
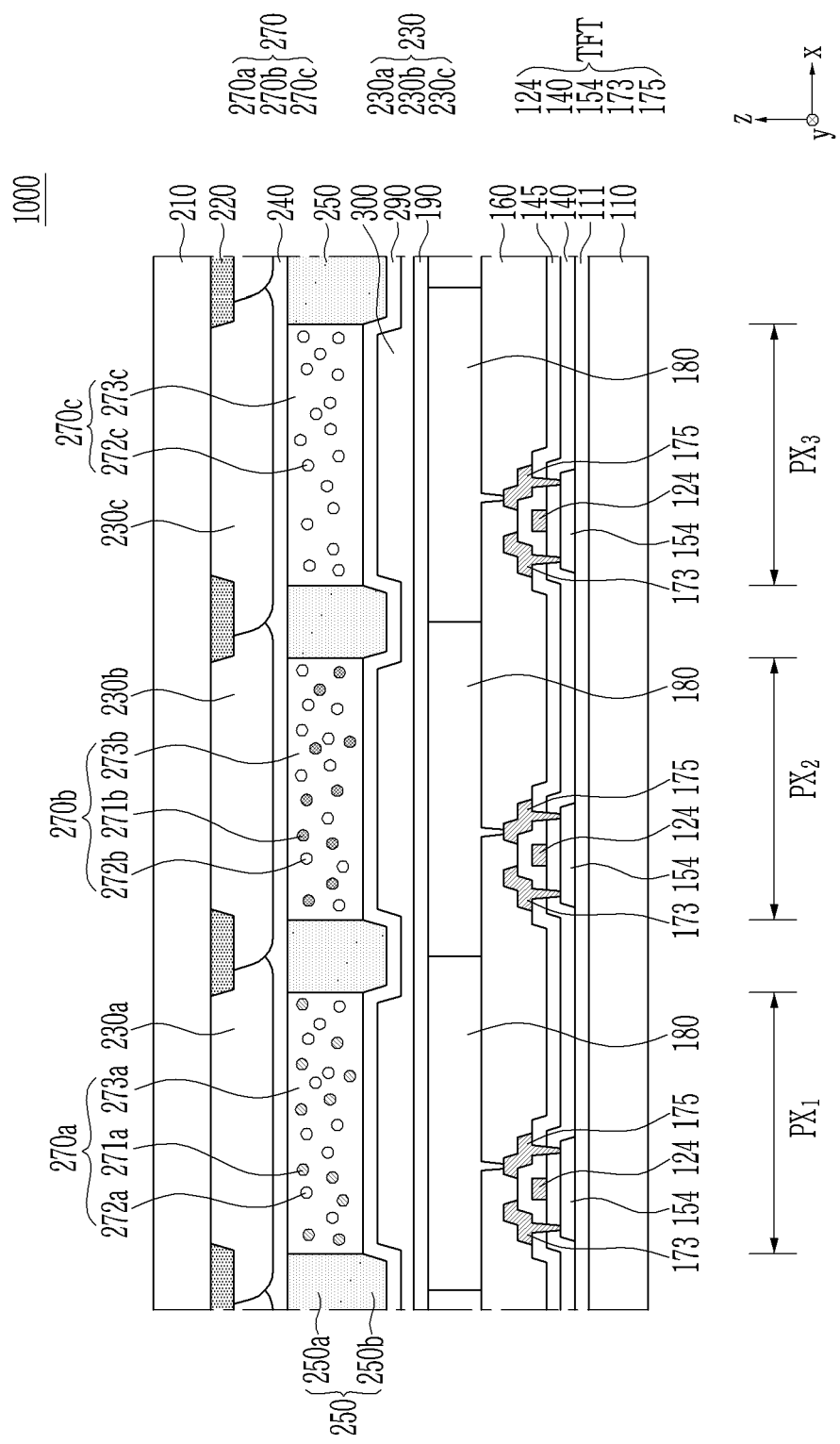
FIG. 10 is a cross-sectional view illustrating another example of the display panel illustrated in FIGS. 1 to 3.

FIG. 10 is a cross-sectional view illustrating another example of the display panel illustrated in FIGS. 1 to 3.

Referring to FIG. 10, the display panel 1000 according to the present embodiment may include a light emitting panel 100, a color conversion panel 200, a light transmitting layer 300 between the light emitting panel 100 and the color conversion panel 200, and a binding element 400 for combining the light emitting panel 100 and the color conversion panel 200 to each other. The light emitting panel 100 may include a lower substrate 110, a buffer layer 111, a thin film transistor TFT, a light emitting element 180, and an encapsulation layer 190, and the color conversion panel 200 may include an upper substrate 210, a light blocking pattern 220, a color filter layer 230, a planarization layer 240, first and second banks 250a and 250b, a color conversion layer 270, and an encapsulation layer 290.

In one or more embodiments described herein, the display panel 1000 may include a first bank 250a and a second bank 250b which may be formed through a single process. The first bank 250a and the second bank 250b may be formed of the same material, for example, at one time through a lithographic process by using one mask. Accordingly, the first bank 250a defining each region of the color conversion layer 270 and the second bank 250b playing a role of a spacer keeping a gap between the light emitting panel 100 and the color conversion panel 200 may be formed at the same time, simplifying the process. In addition, the first bank 250a and the second bank 250b may have the aforementioned refractive index characteristics and transflective characteristics and thus may effectively scatter and/or reflect light emitted from the light emitting element 180 of the light emitting panel 100 toward the upper substrate 210 and increase light efficiency.

The aforementioned display panel 1000 may be applied to various suitable electronic devices including a display device, and may be applied to a display device such as a TV, a monitor, a computer, a tablet PC, a mobile, and/or a lighting device such as a light source.

While the subject matter of this disclosure has been described in connection with what is presently considered to be practical embodiments, it is to be understood that the present disclosure is not limited to the disclosed embodiments, but, on the contrary, is intended to cover various modifications and equivalent arrangements included within the spirit and scope of the appended claims, and their equivalents.

What is claimed is:

1. A display panel, comprising:
a light emitting panel, and
a color conversion panel facing the light emitting panel, wherein the color conversion panel converts an emission spectrum of light emitted from the light emitting panel,
wherein the color conversion panel comprises:
a color conversion layer comprising a plurality of regions, the plurality of regions comprising a color conversion region, and
a bank defining each region of the color conversion layer,
wherein the color conversion region comprises quantum dots,
wherein a refractive index of the bank is lower than a refractive index of the quantum dots, and
wherein the bank is a transflective bank having a transmittance of about 10% to about 70%.

2. The display panel of claim 1, wherein:
each of the refractive indexes of the quantum dots at wavelengths of about 460 nm, about 550 nm, and about 630 nm is about 1.6 to about 2.0, and
the refractive index of the bank at wavelengths of about 460 nm, about 550 nm, and about 630 nm is about 1.1 to about 1.4.

3. The display panel of claim 2, wherein a difference between the refractive index of the quantum dots and the refractive index of the bank is about 0.2 to about 0.8.

4. The display panel of claim 1, wherein the color conversion region and the bank are in direct contact.

5. The display panel of claim 1, wherein the bank comprises a plurality of pigments and a plurality of scatterers, wherein the plurality of pigments has a different absorption spectra than the plurality of scatterers.

6. The display panel of claim 5, wherein the plurality of pigments comprise at least two selected from a first pigment having a maximum absorption wavelength in a range of greater than or equal to about 380 nm and less than about 500 nm, a second pigment having a maximum absorption wavelength in a range of about 500 nm to about 600 nm, and a third pigment having a maximum absorption wavelength in a range of greater than about 600 nm and less than or equal to about 780 nm.

7. The display panel of claim 5, wherein the plurality of scatterers comprise silicon oxide, zinc oxide, titanium oxide, tantalum oxide, niobium oxide, tin oxide, magnesium oxide, nanosilicate, calcium carbonate, calcium fluoride, porogen, or a combination thereof.

8. The display panel of claim 1, wherein:
the bank comprises:
a first bank between the adjacent color conversion regions, and
a second bank connected to or separated from the first bank and protruding toward the light emitting panel.

9. The display panel of claim 8, wherein the second bank is connected to the first bank and comprises the same material as the first bank.

10. The display panel of claim 1, wherein:
the light emitting panel comprises a light emitting element emit light of a first emission spectrum,
the color conversion layer comprises:
a first color conversion region comprising a first quantum dot, wherein the first color conversion region converts light of the first emission spectrum into light of a second emission spectrum,
a second color conversion region comprising a second quantum dot, wherein the second color conversion region converts light of the first emission spectrum into light of a third emission spectrum, and
a light transmitting region through which light of the first emission spectrum passes, and
the refractive indexes of the bank at a wavelength of the first, second, and third emission spectra are respectively lower than the refractive indexes of the first quantum dot and the second quantum dot at a wavelength of the first, second, and third emission spectra.

11. The display panel of claim 10, wherein:
the first emission spectrum is a blue emission spectrum,
the second emission spectrum is a red emission spectrum, and
the third emission spectrum is a green emission spectrum.

12. The display panel of claim 1, wherein the color conversion panel further comprises a color filter layer positioned in a direction in which light passing through the color conversion layer is emitted.

13. The display panel of claim 1, further comprising a light transmitting layer between the light emitting panel and the color conversion panel.

14. The display panel of claim 1, wherein the light emitting panel comprises an organic light emitting diode, a quantum dot light emitting diode, a perovskite light emitting diode, a micro light emitting diode, an inorganic nano light emitting diode, or a combination thereof.

15. The display panel of claim 14, wherein the light emitting panel emits light of a blue emission spectrum.

16. The display panel of claim 14, wherein the inorganic nano light emitting diode comprises a nanostructure comprising gallium nitride, indium gallium nitride, aluminum gallium nitride, or a combination thereof.

17. An electronic device comprising the display panel of claim 1.

18. A display panel, comprising:
a light emitting panel, and
a color conversion panel facing the light emitting panel, wherein the color conversion panel converts an emission spectrum of light emitted from the light emitting panel,
wherein the color conversion panel comprises:
a color conversion layer comprising a plurality of regions, the plurality of regions comprising a color conversion region, and
a bank defining each region of the color conversion layer,
wherein the color conversion region comprises quantum dots,
wherein a refractive index of the bank is lower than a refractive index of the quantum dots, and
wherein the bank concurrently satisfies a refractive index of about 1.1 to about 1.4 and a transmittance of about 10% to about 70% at wavelengths of about 460 nm, about 550 nm, and about 630 nm.

19. A display panel, comprising:
a light emitting panel, and
a color conversion panel facing the light emitting panel, wherein the color conversion panel converts an emission spectrum of light emitted from the light emitting panel,
wherein the color conversion panel comprises:
a color conversion layer comprising a plurality of regions, the plurality of regions comprising a color conversion region, and
a bank defining each region of the color conversion layer,
wherein the color conversion region comprises quantum dots,
wherein a refractive index of the bank is lower than a refractive index of the quantum dots,
wherein:
the bank comprises:
a first bank between the adjacent color conversion regions, and
a second bank connected to or separated from the first bank and protruding toward the light emitting panel, and
wherein:
a surface of the first bank is hydrophilic, and
a surface of the second bank is hydrophobic.

* * * * *